United States Patent [19]
Mizutani

[11] Patent Number: 5,532,091
[45] Date of Patent: Jul. 2, 1996

[54] ALIGNING METHOD

[75] Inventor: Shinji Mizutani, Kanagawa-ken, Japan

[73] Assignee: Nikon Corporation, Tokyo, Japan

[21] Appl. No.: 400,564

[22] Filed: Mar. 8, 1995

[30] Foreign Application Priority Data

Mar. 9, 1994 [JP] Japan .................................. 6-038076

[51] Int. Cl.⁶ ...................................................... G03F 9/00
[52] U.S. Cl. .................. 430/22; 430/5; 355/53; 355/57; 356/399; 356/401
[58] Field of Search ............................ 430/22, 5; 355/53, 355/77; 356/399, 401

[56] References Cited

U.S. PATENT DOCUMENTS 5,005,046  4/1991  Hashimoto .................. 355/77
5,262,822  11/1993  Kosugi et al. .................. 355/53

*Primary Examiner*—S. Rosasco
*Attorney, Agent, or Firm*—Armstrong, Westerman, Hattori, McLeland & Naughton

[57] ABSTRACT

Three layer patterns are formed on a shot area, and wafer marks for X axis and wafer marks for Y axis are formed in each of the first to third layers. When a reticle pattern to be exposed has a certain relationship with the first and second layer patterns, an alignment reference coordinate value is determined on the basis of coordinate values of the wafer marks in the first and second layers. Alignment between a predetermined shot area and a reticle pattern is performed on the basis of the alignment reference coordinate value. The alignment reference coordinate value can be determined on the basis of an average value or a weighted mean value of the coordinate values of the wafer marks.

8 Claims, 4 Drawing Sheets

ALIGNING METHOD

BACKGROUND OF THE INVENTION

1. Field of the Invention

The present invention relates to a method for positioning or aligning a mask pattern with a substrate to be exposed in exposure apparatuses used in the manufacture of microdevices such as semiconductor elements or liquid crystal display elements, for example, and more particularly, it relates to an aligning method particularly applicable when additional patterns are exposed, in a superimposed fashion, on a shot area where plural-layer patterns have already been formed on a substrate to be exposed.

2. Related Background Art

When semiconductor elements or liquid crystal display elements are manufactured by a lithographic technique, exposure apparatuses for exposing a pattern on a photomask or a reticle (hereinafter, "reticle" is explained as an example) onto each of shot areas on a wafer (or glass plate or the like) on which a photosensitive material is coated have been used. Among the exposure apparatuses of this kind, exposure apparatus of so-called step-and-repeat type wherein a wafer stage on which the wafer is mounted is shifted step-by-step (stepping) so that reticle pattern is successively exposed onto each of the shot areas have been widely used. Recently, there have been proposed projection optical apparatuses of so-called step-and-scan type wherein the reticle pattern is exposed in a zone wider than an exposure field of a projection optical system by scanning the reticle and the wafer in synchronous with each other.

For example, since the semiconductor element is formed by superimposing plural-layer circuit patterns on the wafer, for example when second, third and other layer circuit patterns are exposed onto the wafer, positioning (alignment) between each of the shot areas of the wafer on which the circuit patterns have already been formed and an image of the reticle pattern, i.e. alignment between the wafer and the reticle must be effected with high accuracy.

In conventional aligning methods, the above-mentioned alignment was effected by using a last-formed mark layer, i.e. an uppermost mark layer alone as a reference. Thus, positional deviation amounts are gradually accumulated or totalized, thereby causing a problem that the positional deviation amount is increased as the mark layer goes upwardly. More specifically, for example, in the case where it is assumed that wafer marks are formed on all of the mark layers, when a maximum value of an error amount of the alignment of the circuit pattern in an X direction from the wafer mark of the last layer (used as a reference) is $\Delta X$, in the N-th layer, the positional deviation amount of $(N-1) \cdot \Delta X$ will occur at the maximum.

In the semiconductors, patterns related to each other are not necessarily formed on adjacent layers. That is to say, when a pattern formed in an N-th layer film is to be electrically connected to a pattern formed in an (N-2)th layer film, it is necessary to suppress the positional deviation amount between the pattern on the N-th layer and the pattern on the (N-2)th layer as much as possible. However, in the prior art, since the alignment is effected by using the pattern on the last layer as the reference, aligning accuracy between the related layers could not be improved.

SUMMARY OF THE INVENTION

The present invention aims to solve the above-mentioned conventional problems, and an object of the present invention is to provide an aligning method wherein positional deviation amount can be minimized when patterns are exposed, in a superimposed fashion, on a substrate (semiconductor wafer, glass plate or the like) on which plural-layer patterns have already been formed.

Another object of the present invention is to provide an aligning method wherein positional deviation amount between related layers can be minimized.

The present invention provides an aligning method for performing alignment between a mask pattern and a predetermined exposure area on a substrate on which a plurality of layer patterns have already been formed, when the mask pattern is exposed onto the exposure pattern.

This aligning method comprises the steps of selecting at least two layer patterns on which alignment marks are formed, among a plurality of layer patterns; determining coordinate values of the alignment marks on the selected layer patterns; determining an alignment reference coordinate value on the basis of the coordinate values of the alignment marks; and performing alignment between the predetermined exposure area and the mask pattern on the basis of the alignment reference coordinate value.

The alignment reference coordinate value is determined in consideration of an average value or a weighted mean value of the coordinate values of the alignment marks.

DETAILED DESCRIPTION

Before an embodiment of the present invention is explained, to facilitate the understanding of the present invention, a conventional aligning method will be explained with reference to FIG. 5.

Figure 5:
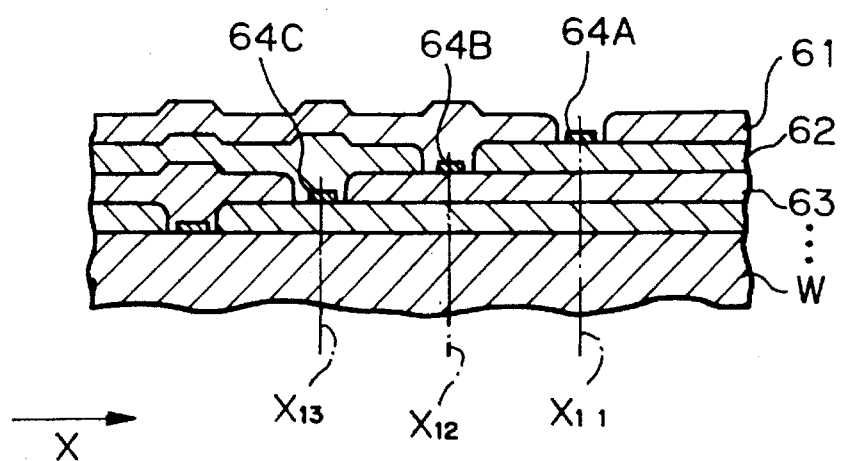
FIG. 5 is a partial enlarged sectional view of an arrangement used in a conventional aligning method.

FIG. 5 is a sectional view of a wafer W on which a plurality of layer patterns have already been formed, taken along an X direction. In FIG. 5, from the above, an N-th (N=integral number more than 2) film 61, an (N–1)th film 62 and an (N–2)th film 63, . . . are successively laminated on the wafer W, and circuit patterns are formed in the films 61, 62, 63, . . . , respectively. Alignment wafer marks 64B (position $X_{12}$), 64C (position $X_{13}$), . . . are formed on surfaces of previous layer adjacent to the films 61, 62, 63, . . . , respectively. The wafer marks 64A, 64B, 64C, . . . are formed at the same time when the circuit patterns are formed in the films 61, 62, 63, . . . . The films 61, 62, 63 are oxidized films, for example, and the wafer marks 64A, 64B, 64C are formed from metal films, for example.

In the prior art, for example, when the pattern in the N-th film 61 is exposed, the position $X_{12}$ of the wafer mark 64B formed on the surface of the (N−1)th film 62 which is the last layer for the N-th film is detected by the alignment system, and, for example, after a reference position (such as a center of the exposure field of the projection exposure system and the like) obtained by adding a design offset value between a shot area center and the detected position $X_{12}$ on the wafer W is determined, the reticle pattern is exposed. Among circuit pattern layers, since there are layers on which the wafer marks are not formed, if the wafer mark is not formed on the just previous layer, the position of the wafer mark on any previous layer on which the wafer mark has been last-formed (referred to as "latest previous layer" hereinafter) is detected.

Figure 3A:
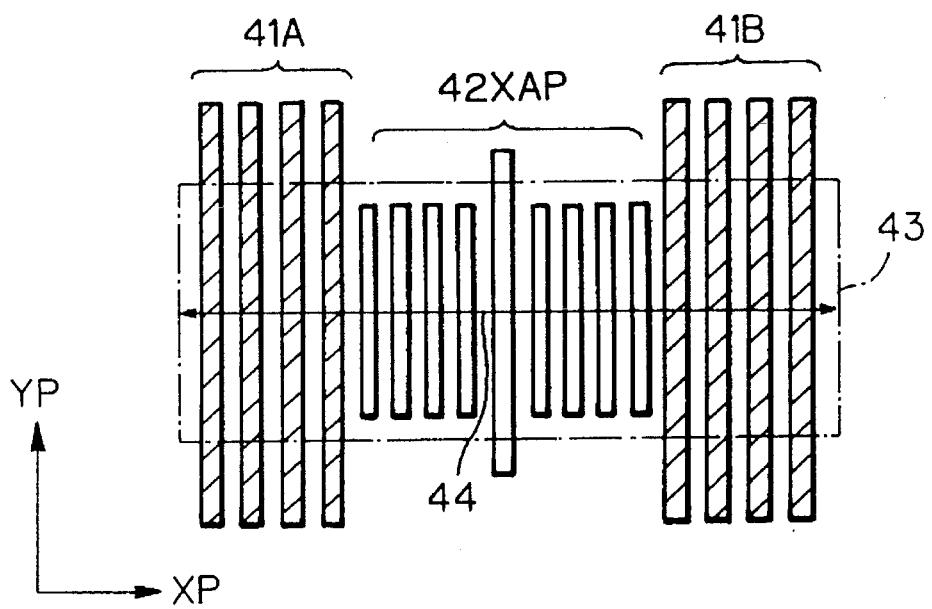
FIG. 3 is a view for explaining a method for detecting the wafer marks, where a section (a) is a view showing an observation field of an FIA system of FIG. 2, and a section (b) is an explanatory view when positions of the wafer marks are detected by an alignment system 17 of LSA type of FIG. 2.
Figure 3B:
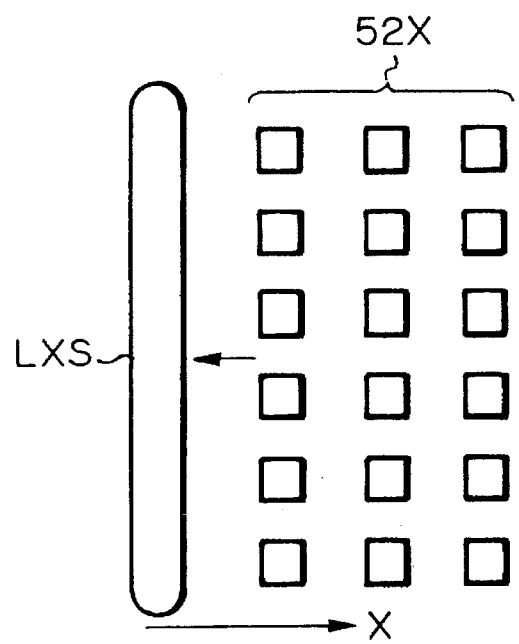
Figure 4:
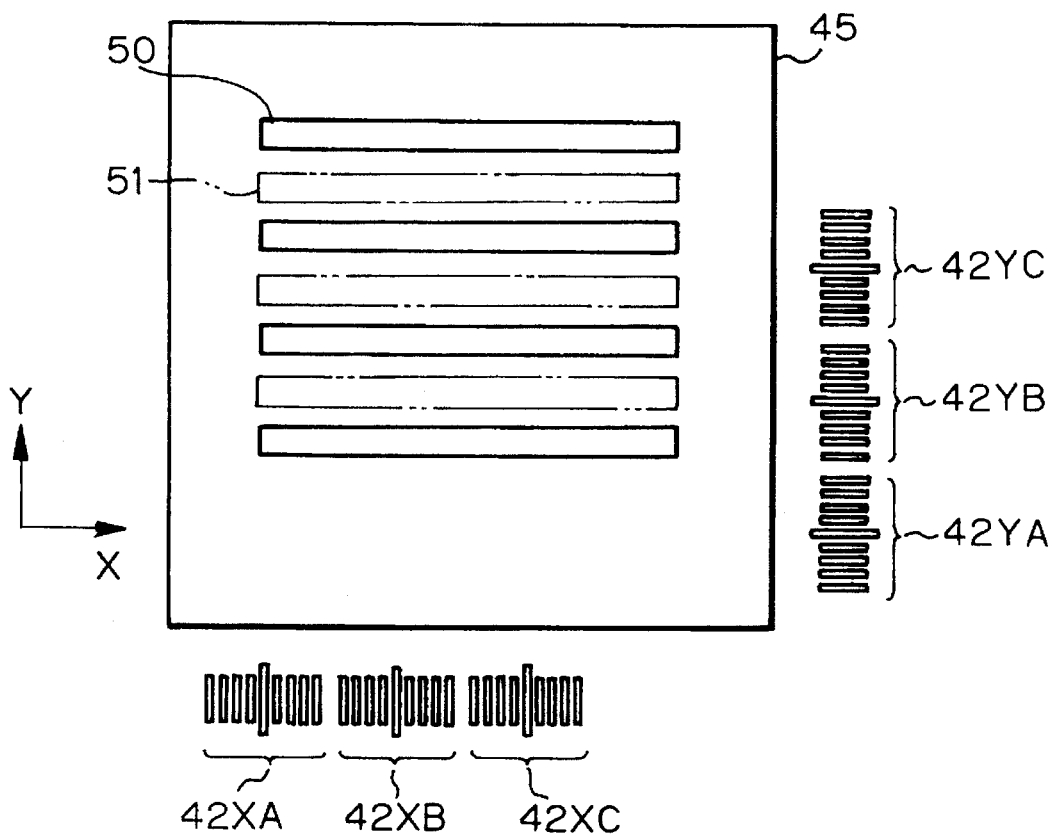
FIG. 4 is an enlarged plan view showing an example of a pattern when wafer marks different in X and Y directions are used for alignment.

Now, an aligning method according to a preferred embodiment of the present invention will be explained with reference to FIGS. 2 to 4.

Figure 2:
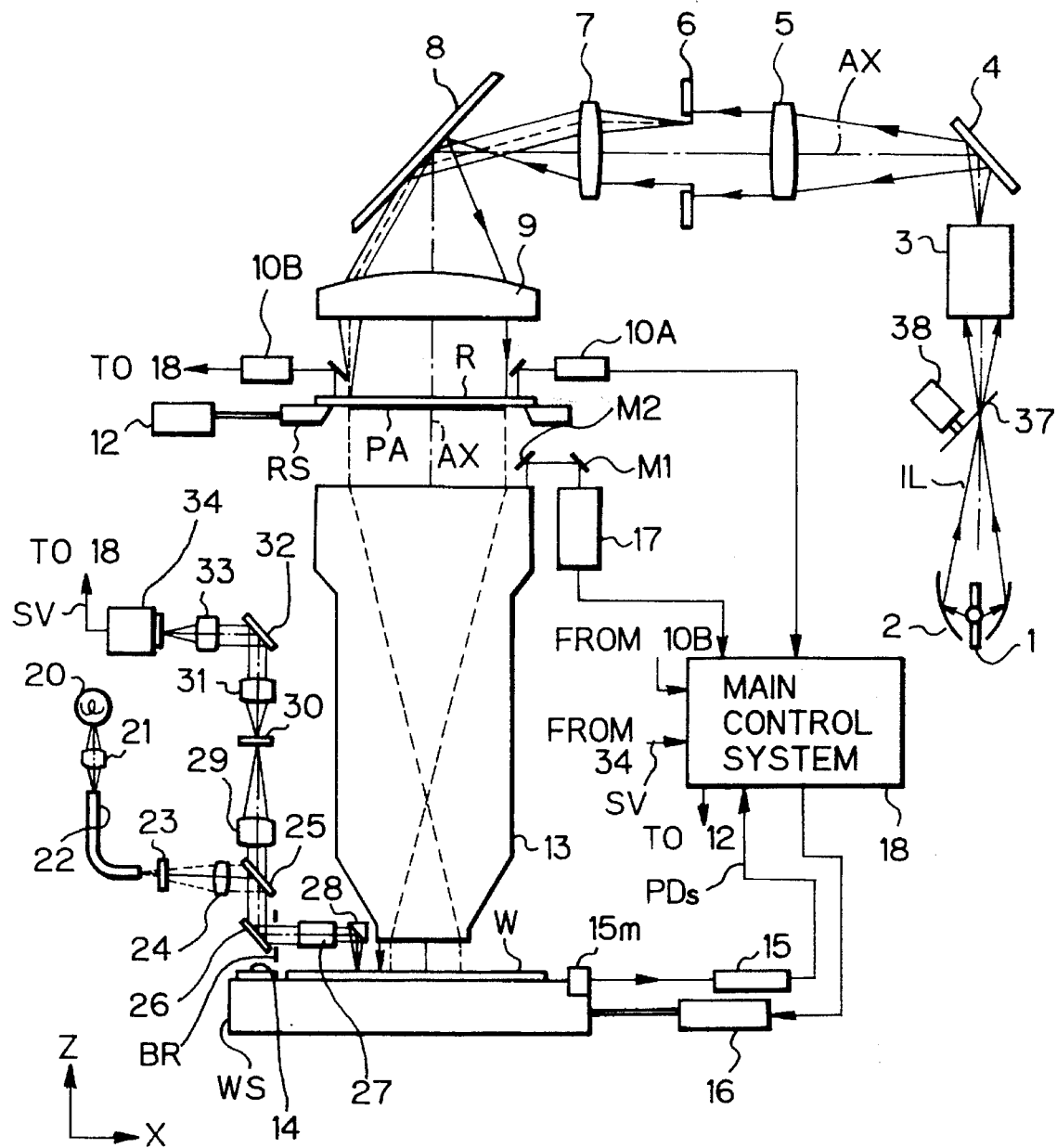
FIG. 2 is a schematic illustration of a projection exposure apparatus used with the preferred embodiment of the present invention.

FIG. 2 shows a schematic construction of a projection exposure apparatus to which the aligning method according to the present invention is preferably applied. In FIG. 2, illumination light IL emitted from a super-high mercury lamp 1 is reflected by an elliptical mirror 2 to be focused at a second focus thereof and then enters an illumination optical system 3 including a collimator lens, an interference filter, an optical integrator (fly-eye lens), an aperture stop (σ stop) and the like.

A shutter (for example, four-bane rotary shutter) 37 driven to close and open a light path for the illumination light IL is disposed in the vicinity of the second focus of the elliptical mirror 2. The illumination light for exposure may be laser light from an excimer laser (for example, KrF excimer laser, ArF excimer laser and the like) or a high-harmonic wave from a metal vapor laser or a YAG laser.

In FIG. 2, a main portion illumination light (i-ray and the like) IL having a wave length band capable of exposing a photoresist layer and emitted from the illumination optical system 3 is reflected by a beam splitter 4 to reach a mirror 8 through a first relay lens 5, a variable field stop (reticle blind) 6 and a second relay lens 7. The illumination light IL reflected by the mirror 8 toward a downward vertical direction is uniformly directed onto a pattern area PA on a reticle R through a main condenser lens 9. A plane on which the reticle blind 6 is disposed has a conjugate relation to a pattern surface of the reticle R so that an illumination field of the reticle R can freely be adjusted by changing a size and a shape of an aperture portion of the reticle blind 6.

In the reticle R according to the illustrated embodiment, reticle marks used as alignment marks are formed at central portions of four sides or edges of the pattern area PA encircled by a light shield band. By projecting images of the reticle marks onto the photoresist layer on the wafer W, the reticle mark images are formed on the photoresist layer as latent images. That is to say, the wafer marks act as means for forming wafer marks. In the illustrated embodiment, the reticle marks are also used as the alignment marks when alignment between each shot area on the wafer W and the reticle R is effected. The reticle marks are constituted by light blocking portions made of chrome and the like and provided on a transparent window of the reticle R encircled by the light shield band. Further, alignment marks comprised of two crisscross light blocking marks are disposed around a periphery of the reticle R in an opposed relation. These two alignment marks are used for performing the alignment of the reticle R (positioning of the reticle with respect to an optical axis AX of a projection optical system 13).

The reticle R can be finely shifted by a motor 12 in a direction of the optical axis AX of the projection optical system 13 and is mounted on a reticle stage RS which can be shifted two-dimensionally and rotated minutely in the plane normal to the optical axis. Reticle alignment systems (RA systems) 10A, 10B disposed above the reticle R serve to detect the above-mentioned two crisscross alignment marks formed around the periphery of the reticle R. By finely shifting the reticle stage RS on the basis of measurement signals from the RA systems 10A, 10B, the reticle R is positioned so that the central point of the pattern area PA is aligned with the optical axis AX of the projection optical system 13.

The illumination light IL passed through the pattern area PA of the reticle R is directed to the bi-telecentric (or uni-telecentric) projection optical system 13, with the result that a projected image of the circuit pattern of the reticle R which is reduced to, for example, 1/5, by the projection optical system 13 is projected (focused) onto one shot area on the wafer W on which the photoresist layer is coated and which is held in alignment with a best focusing plane of the projection optical system 13.

The wafer W is held, by vacuum force, to a wafer holder (not shown) which can be rotated minutely, and is mounted on the wafer stage WS via the wafer holder. The wafer stage WS can be shifted two-dimensionally by a motor 16 in a step-and-repeat manner, so that, after the circuit pattern of the reticle R is exposed to one shot area on the wafer W, the wafer stage WS is shifted to a next shot position (stepping to the next shot area). A movable mirror $15m$ for reflecting a laser beam from a laser interferometer 15 is secured to an end of the wafer stage WS so that the two-dimensional coordinate values of the wafer stage WS are always detected by the laser interferometer 15 with a resolving power of about 0.01 μm, for example. The laser interferometer 15 serves to measure the coordinates of the wafer stage WS in a direction (referred to as "X direction" hereinafter) perpendicular to the optical axis AX of the projection optical system 13 and in a Y direction perpendicular to the X direction. On the basis of these coordinates in the X and Y directions, a stage coordinate system (stationary coordinate system) (X,Y) of the wafer stage WS is determined. That is to say, the coordinate values of the wafer stage WS measured by the laser interferometer 15 correspond to the coordinate values in the stage coordinate system (X,Y).

A reference member (glass substrate) 14 having a reference mark used in the measurement of a base line amount (a deviation amount between a reference position of the alignment system and a reference position for the exposure) is provided on the wafer stage WS substantially in flush with the exposure surface of the wafer W.

A field image alignment system (referred to as "FIA system" hereinafter) of off-axis type is disposed at one side of the projection optical system 13. In this FIA system, light emitted from a halogen lamp 20 is directed, through a condenser lens 21 and an optical fiber 22, to an interference filter 23, where light components having photosensitive wavelength bands for the photoresist layer and infrared wavelength band are removed. The light passing through the interference filter 23 is directed to a telecentric objective lens 27 through a lens system 24, a beam splitter 25, a mirror 26 and a field stop BR. The light leaving the objective lens 27 is reflected by a prism (or mirror) 28 secured to a lower portion of a lens barrel of the projection optical system 13 not to shield the illumination field of the projection optical system 13, and the reflected light is directed to the wafer substantially vertically.

The light from the objective lens 27 is directed onto an area on the wafer W having a wafer mark (ground mark), and the light reflected from this area is directed to an index plate 30 through the prism 28, objective lens 27, field stop BR, mirror 26, beam splitter 25 and a lens system 29. The index plate 30 is disposed on a plane conjugate with the wafer W with respect to the objective lens 27 and the lens system 29 so that an image of the wafer mark on the wafer W is focused onto a transparent window of the index plate 30. Two straight marks extending in the Y direction and spaced apart from each other by a predetermined distance in the X direction are formed in the transparent window of the index plate 30 as index marks. The light passing through the index plate 30 is directed to an imaging element (CCD camera and the like) 34 through a first relay lens system 31, a mirror 32 and a second relay lens system 33, so that the images of the wafer mark and of the index marks are focused on a light receiving surface of the imaging element 34. An image signal SV from the imaging element 34 is sent to a main control system 18, where the position (coordinate value) of the wafer mark in the X direction is calculated. Although not shown in FIG. 2, besides the above-mentioned FIA system (for X axis), another FIA system (for Y axis) for detecting the mark position in the Y direction is also provided.

A TTL (through-the-lens) alignment system 17 of laser-step-alignment type (referred to as "LSA type" hereinafter) is disposed at one side of an upper portion of the projection optical system 13 so that position detecting light from the alignment system 17 is directed to the projection optical system 13 through mirrors M1 and M2. The position detecting light passes through the projection optical system 13 and is directed onto the wafer W as an elongated slit-shaped spot (extending in the Y direction) light in the proximity of the wafer mark, and diffracted light from the wafer mark is returned to the alignment system 17 through the projection optical system 13 and the mirrors M1, M2. The alignment system 17 converts the diffracted light into a detection signal which is in turn sent to the main control system 18. When the wafer stage WS is scanned in the X direction to move the spot light and the wafer mark relative to each other, a signal is generated from the alignment system 17. This signal is sent to the main control system 18 which in turn determines the position of the wafer mark on the wafer W in the X direction on the basis of the signal. Another alignment system of LSA type for determining the position of the wafer mark in the Y direction is also provided. More detailed contents of the LSA alignment systems are disclosed U.S. Pat. No. 5,151,750.

Next, an exposing operation according to this embodiment will be explained.

Figure 1A:
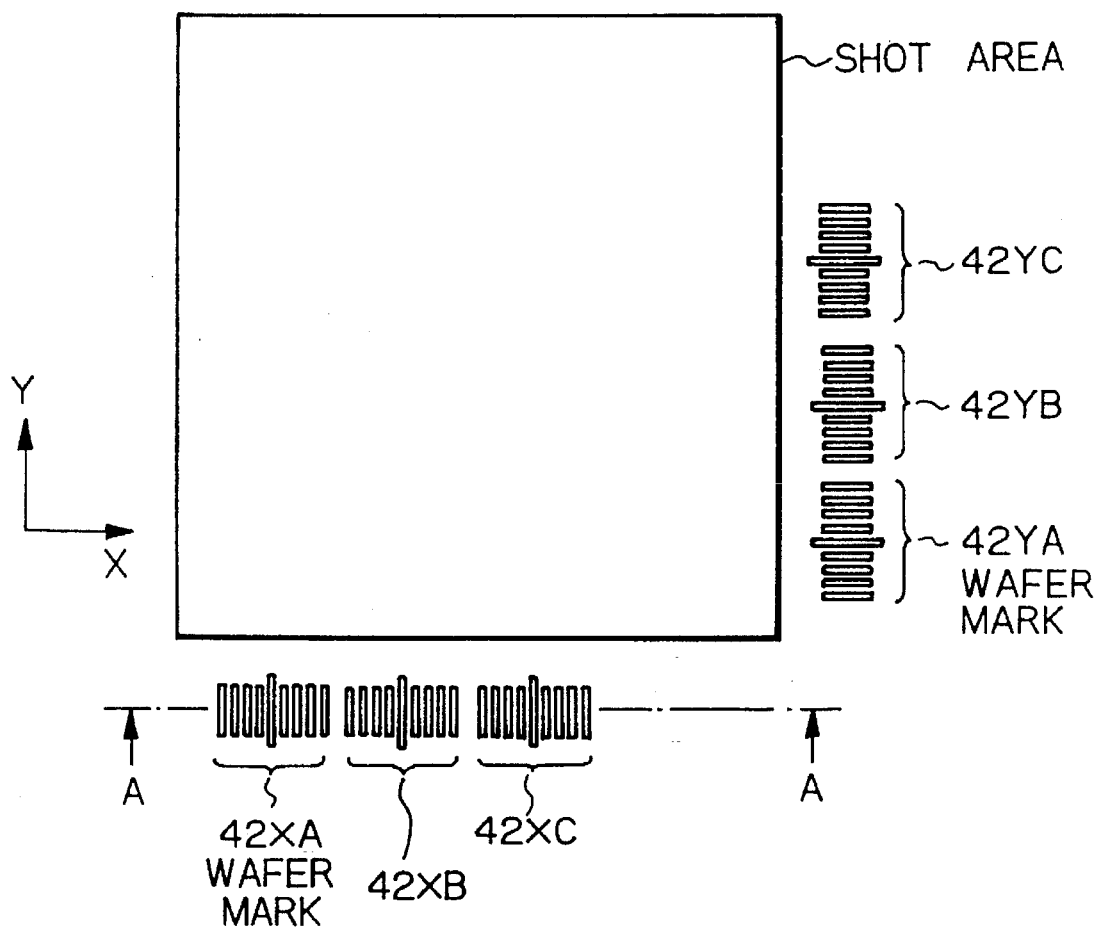
FIG. 1 is a view showing a relation between a wafer and a shot area to be exposed according to a preferred embodiment of the present invention, where a section (a) is an enlarged plan view showing arrangement of wafer marks and the shot area, and a section (b) is a sectional view taken along the line A—A in the section (a)
Figure 1B:
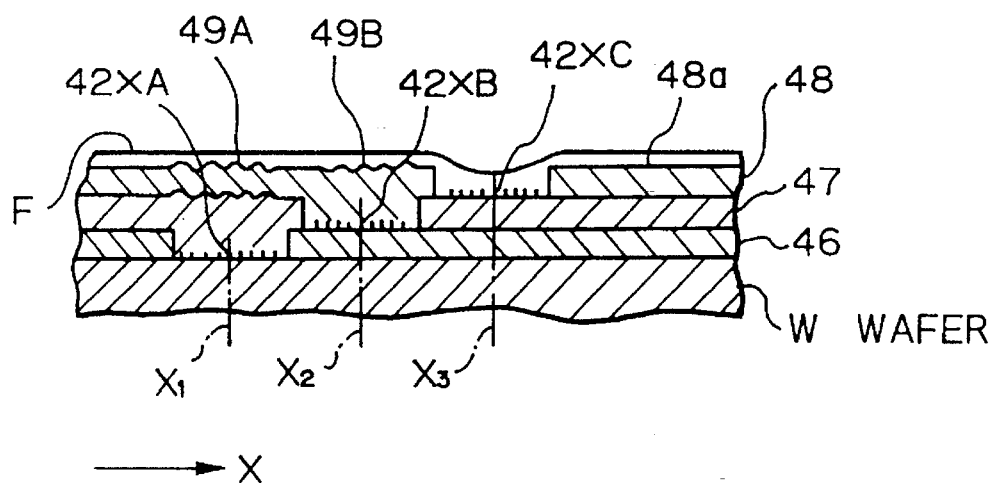

In FIG. 1, a section (a) (referred to as "FIG. 1(a)" hereinafter) is an enlarged plan view of the shot area 45 on the wafer W to be exposed in this embodiment, and a section (b) (referred to as "FIG. 1(b)" hereinafter) is a sectional view taken along the line A—A in FIG. 1(a). Incidentally, the portion shown in FIG. 1(b) is further enlarged in a direction of a thickness of the wafer. In FIG. 1(b), a circuit pattern in a first layer film 46, a circuit pattern in a second layer film 47 and a circuit pattern in a third layer film 48 have already been formed on the wafer W (three-layer patterns). Further, a positioning wafer mark 42XA is formed in the first layer film 46 (contacted with the surface of the wafer W), a wafer mark 42XB is formed in the second layer film 47 (contacted with a surface of the film 46) offset from the wafer mark 42XA in the X direction, and a wafer mark 42XC is formed in the third layer film 48 (contacted with a surface of the film 47) offset from the wafer mark 42XB in the X direction. The photoresist layer F is coated on a surface of the third layer film 48.

As shown in FIG. 1(a), the wafer marks 42XA–42XC are disposed in the proximity of a lower edge of the shot area 45 and are equidistantly spaced apart from each other in the X direction. In other words, the wafer marks provided in association with the first to third layer patterns correspond to the wafer marks 42XA–42XC, respectively. The portions in the first to third layer films 46–48 covering the respective wafer marks 42XA–42XC are removed. Accordingly, for example, the third layer wafer mark 42XC can surely be detected.

Explaining the wafer marks in more detail, the wafer marks 42XA, 42XB, 42XC are used in association with the FIA alignment system for the X axis, and each wafer mark comprises nine slit-shaped patterns extending in the Y direction and spaced apart from each other by a predetermined pitch in the X direction. Among these nine slit-shaped patterns, a central pattern is longest. In the illustrated embodiment, an average value of the measured positions of the nine slit-shaped patterns in the X direction is assumed as X coordinate value of the associated wafer mark. However, lengths of all of nine slit-shaped patterns in each wafer mark (in the Y direction) may be equal to each other, or the number of the slit-shaped patterns may be changed.

Similarly, wafer marks 42YA, 42YB, 42YC (for the Y axis) are disposed in the proximity of a side edge (for example, right side edge) of the shot area 45 and are equidistantly spaced apart from each other in the Y direction. The wafer marks 42YA, 42YB, 42YC are disposed at the positions where the wafer marks 42XA, 42XB, 42XC reach when they are rotated by 90 degrees.

When it is desired to expose the pattern of the reticle R of FIG. 2 onto a surface 48a of the third layer film 48 of FIG. 1(b) at the shot area 45, in the illustrated embodiment, the center of the shot area 45 is aligned with the center (on the optical axis AX) of the exposure field of the projection optical system 13 in the following manner. Now, it is assumed that, among the three-layer circuit patterns in FIG. 1(b), the patterns which have certain relationship with the pattern of the reticle R, (i.e., the patterns to be connected to each other) are the circuit patterns in the first layer film 46 and in the second layer film 47.

In this case, in the illustrated embodiment, by using the FIA system of off-axis type including the imaging element 34 of FIG. 2, the positions (in the X direction) of the wafer mark 42XA in the first layer and the wafer mark 42XB in the second layer shown in FIG. 1(b) are measured.

A section (a) in FIG. 3 (referred to as "FIG. 3(a)" hereinafter) shows an image on the index plate 30 of the FIA system of FIG. 2. In FIG. 3(a), the image 42XAP of the wafer mark 42XA is focused between two index marks 41A and 41B. An image in the observation field 43 extending to include the index marks 41A, 41B and the wafer mark image 42XAP is picked-up by the imaging element 34. The imaging element 34 creates the image signal in the observation field 43 along a scan line 44 parallel with a direction XP corresponding to the X direction, and the image signal is sent to the main control system 18. In the main control system 18, the position of the wafer mark 42XA with respect to the index marks 41A, 41B is detected by treating or processing the image signal, and the X-coordinate $X_1$ of the wafer mark 42XA is determined by adding the X-coordinate value measured by the laser interferometer 15 to the detected position.

In FIG. 1(b), since the photoresist layer F is substantially transparent for the alignment light, when the films 46–48 are transparent, the image of the wafer mark 42XA is directly observed by the imaging element 34, and the position of the wafer mark can be detected on the basis of the observed image. Even if the films 46–48 are opaque, since there is an irregular (concavo-convex) portion 49A on the surface of the uppermost layer film 48 above the wafer mark 42XA, by observing the rugged portion 49a, the position of the wafer mark 42XA can practically be detected. Similarly, the wafer mark 42XB provided in the second layer can be detected by the FIA system, and the X-coordinate $X_2$ of the wafer mark 42XB can be determined on the basis of the detected result. Of course, the position of the wafer mark 42XB may be detected by observing a rugged portion 49B on the uppermost layer film 48.

If the films 46–48 are opaque, in place of the measurement of the positions of the rugged portions 49A, 49B, when the second layer is exposed, the X-coordinate $X_1$ of the wafer mark 42XA may be measured and stored, and, when the third layer is exposed, the X-coordinate $X_2$ of the wafer mark 42XB may be measured and stored. Further, when a fourth layer is exposed, the stored coordinates may be read out and utilized.

In design, for example, it is assumed that the position to be aligned with the X-coordinate of the center of the exposure field of the projection optical system 13 is determined by adding an offset amount $\Delta A$ to the X-coordinate $X_1$ of the wafer mark 42XA and the position to be aligned with the X-coordinate of the center of the exposure field of the projection optical system 13 is also determined by adding an offset amount $\Delta B$ to the X-coordinate $X_2$ of the wafer mark 42XB. In this case, in the illustrated embodiment, a position on the wafer W having an X-coordinate $X_S$ calculated from the following equation (1) is aligned with the X-coordinate of the center of the exposure field of the projection optical system 13:

$$X_S = \{(X_1+\Delta A)+(X_2+\Delta B)\}/2 \quad (1)$$

By using such an X-coordinate $X_S$, the alignment is effected in such a manner that positional deviation amounts (in the X direction) between averaged of the first and second layer patterns in the shot area 45 and the position of the projected pattern of the reticle R (which is to be exposed onto the layer patterns already made) are minimized, whereby avoiding the fact that the positional deviation amount is zero between the reticle pattern and one of the layer patterns but the positional deviation amount between the reticle pattern and the other layer pattern becomes great.

In FIG. 1(a), among the Y-axis wafer marks indicating the Y-coordinate of the shot area 45, Y-coordinates of the first layer wafer mark 42YA and of the second layer wafer mark 42YB are measured, respectively. By positioning the shot area 45 along the Y direction on the basis of these two Y-coordinates, positional deviation amounts (in the Y direction) between the first and second layer patterns in the shot area 45 and the pattern of the reticle R (which is to be exposed onto such layer patterns) become uniform. Accordingly, the positional deviation amounts (in both X and Y directions) between the reticle pattern to be exposed and the first and second layer patterns associated with the reticle pattern become uniform and are minimized. As a result, in comparison with a case where the positioning is effected only on the basis of the third layer wafer marks 42XC, 42YC, yield of the semiconductor element to be manufactured is improved.

In FIG. 1, for example, if the first layer pattern and the reticle pattern to be exposed have the same fineness and fineness of the second layer pattern is rough in comparison with the first layer pattern, different weights $W_1$, $W_2$ ($W_2<W_1$) may be applied to the first and second layers, respectively. Then, in place of the above equation (1), an X-coordinate $X_S$ of the reference position on the wafer may be determined from the following weighted mean equation:

$$X_S = \{W_1(X_1+\Delta A)+W_2(X_2+\Delta B)\}/(W_1+W_2) \quad (2)$$

In this way, the alignment can be performed while making much of the first layer. However, for example, if it can be estimated that the positional deviation amount of the wafer mark 42XA will be increased by processing the first layer and the positional deviation amount of the wafer mark 42XB will be decreased by processing the second layer, the alignment may be performed while making much of the second layer by using the weight $W_2$ for the second layer greater than the weight $W_1$ for the first layer.

Strictly speaking, all of the three layers shown in FIG. 1(b) have some relationship with the reticle pattern to be exposed. Thus, the X-coordinate $X_3$ of the wafer mark 42XC of the third layer may be measured by the FIA system for the X axis and a Y-coordinate of the wafer mark 42YC may be measured by the FIA system for the Y axis, and the alignment may be performed on the basis of the weighted mean of the coordinate of three wafer marks in the X and Y directions. In this way, the total alignment error can be minimized.

In the above-mentioned embodiment, while an example that the wafer marks in the same layer are used regarding both of the X axis and the Y axis is explained, depending on a pattern to be exposed, a layer having the wafer mark to be used may be changed for each axis. FIG. 4 shows a case where wafer marks in different layers are used for respective axes. In FIG. 4 where the same elements as those shown in FIG. 1 are designated by the same reference numerals, three layer patterns are formed in the shot area 45. Among these patterns, it is assumed that the patterns in the first and second layers comprise elongated patterns 50 extending in the X direction. Further, it is assumed that a reticle pattern to be exposed comprises an elongated pattern 51 extending in the X direction. In this case, although a positional relation between the patterns 50 which have already been formed and the pattern 51 to be exposed in the Y direction must be regulated strictly, a positional relation between the patterns 50, 51 in the X direction is not so critical.

Therefore, alignment regarding the Y direction is performed by using the measured results of the Y-coordinates of the first layer wafer mark 42YA and the second layer wafer mark YB and alignment regarding the X direction is performed, for example, by using the measured result of the X-coordinate of the third layer wafer mark 42XC. By doing so, the alignment accuracy in the Y direction can be enhanced and the measurement regarding the X direction (alignment accuracy is not so critical) can be simplified, thereby shortening the alignment time. If the layers having a certain relationship in the X direction are the second and third layers, regarding the X direction, the alignment may be performed by using the measured results of the X-coordinates of the second layer wafer mark 42XB and the third layer wafer mark 42XC. In this way, the alignment accuracy in the X direction and the alignment accuracy in the Y direction can be set in the optimum conditions, respectively.

In the above-mentioned embodiment, while the marks for the FIA system are used as the wafer marks, as shown in a section (b) in FIG. 3 (referred to as "FIG. 3(b)" hereinafter), a wafer mark 52X for the LSA system may be used. The wafer mark 52X is used for the X axis and comprises square dot patterns arranged in three rows extending in the Y direction and spaced apart from each other by a predetermined pitch. In this case, with respect to the slit-shaped spot light LXS projected onto the wafer from the alignment system 17 through the projection optical system 13, the wafer mark 52X is scanned by driving the wafer stage WS of FIG. 2, thereby detecting the diffraction light from the wafer mark 52X. And, an X-coordinate of the wafer mark 52X is measured on the basis of the detected result. A position of a wafer mark for the LSA system for the Y axis is similarly measured.

Alternatively, a two-beam interference diffraction grating mark (as disclosed in the above-mentioned U.S. Pat. No. 5,151,750) may be used as the wafer mark.

In the above-mentioned embodiment, while an example that the wafer marks 42XA–42XC for the X axis are disposed in a line along the lower side of the shot area 45 as shown in FIG. 1(a) is explained, the wafer marks for the X axis may be distributed around upper and lower sides of the shot area 45.

Furthermore, although two wafer marks are formed in each layer in the foregoing embodiment, the number of the wafer marks is optional. Respective layers also may have different number of wafer marks. A wafer mark may be a one-dimensional mark as shown in FIG. 1(a) or may have a two-dimensional configuration such as crisscross and L shapes. The configuration of the wafer mark is not a factor.

Further, in the above-mentioned embodiment, while an example that the wafer marks are formed in all of the layers is explained, a layer having no wafer mark may be provided between the layers (layer films) having the wafer marks or on the uppermost layer. In this case, the mark to be measured can be selected among the layers having the wafer marks.

In the foregoing embodiment, the position of the wafer shot area (already having a plurality of layer patterns) to be exposed to the pattern-wise image of the reticle R is determined by measuring the positions of the wafer marks of at least two layer patterns which have a certain relationship with the pattern of the reticle R, and obtaining mean value or weighted mean value of these positions. The reticle R and the wafer W are moved relative to each other (alignment operation) and thereafter the shot area (the photoresist layer F on the shot area) is exposed to the image of the pattern of the reticle R. In connection with the alignment operation of a plurality of shot areas on the wafer W, one approach is so-called die-by-die alignment. According to this approach, the positions of the wafer marks of at least two layer patterns with respect to each shot area should be measured so that the measured positions are averaged. Another approach is so-called enhanced global alignment as shown in U.S. Pat. Nos. 4,780,617 and 4,833,621. According to this approach, at least three shot areas are selected and, with respect to each of these selected shot areas, the positions of the wafer marks of at least two layer patterns are measured and averaged to determine the positions of the selected shot areas. The positions of the all shot areas are determined through statistical process based on the positions of these selected shot areas.

The present invention can also be applied to exposure apparatuses of step-and-scan type in which a reticle and a wafer are relatively scanned for exposure, as well as exposure apparatuses of stepper type. In this way, the present invention is not limited to the above-mentioned embodiment, but various alterations and modifications can be adopted without departing from the scope of the present invention.

According to the present invention, since the alignment is performed on the basis of the coordinate values of the plurality of alignment marks having a certain relationship with the mask pattern to be exposed, the alignment errors are not accumulated, and, thus, the alignment error can be reduced. Further, the alignment error between the related layers is also reduced.

When the alignment is performed on the basis of the weighted mean of the coordinate values of the alignment marks in the associated plural layers to which the weighing is adopted, the alignment error between the related layers can be minimized.

When the coordinate values of the alignment marks in the different layers for the first and second directions are used, the alignment errors between the related layers can be minimized in both of the first and second directions, respectively.

In addition, when the alignment is performed by using the coordinate values of the alignment marks in all of the formed layers, the total alignment error can be reduced.

What is claimed is:

1. An aligning method for performing alignment between a mask pattern and a predetermined exposure area on a substrate on which a plurality of layer patterns have been formed, when said mask pattern is projected onto said exposure area, comprising the steps of:

selecting a first alignment mark formed on a first layer pattern and a second alignment mark formed on a second layer pattern which is different from said first layer pattern, among said plurality of layer patterns, each of said first and second alignment marks being in a plurality of slit-shaped patterns extending in a first direction and spaced apart from each other by a predetermined pitch in a second direction which is perpendicular to said first direction;

determining coordinate values of said first alignment mark and said second alignment mark;

determining an alignment reference coordinate value on the basis of the coordinate values of said first alignment mark and said second alignment mark; and effecting alignment between said predetermined exposure area and said mask pattern on the basis of said determined alignment reference coordinate value.

2. An aligning method according to claim 1, wherein said first layer pattern and said second layer pattern are patterns having a certain relationship with said mask pattern.

3. An aligning method according to claim 2, wherein said reference coordinate value is determined by using weighted mean of the coordinate values of said first and second alignment marks, in accordance with the degree of significance in the relationship between said first and second layer patterns and said mask pattern.

4. An aligning method according to claim 1, wherein said reference coordinate value is determined by averaging the coordinate values of said first alignment mark and said second alignment mark.

5. An aligning method according to claim 1, wherein said first layer pattern has a third alignment mark for alignment in a fourth direction transverse to a third direction in which alignment is performed by said first alignment mark and said second layer pattern has a fourth alignment mark for alignment in said fourth direction so that the alignment between said predetermined exposure area and said mask pattern is performed with respect to said third direction and said fourth direction.

6. A method of exposing a plurality of exposure areas on a substrate by applying thereto an image of a pattern of a mask, while performing alignment between a mask pattern and a predetermined exposure area on said substrate on which a first layer pattern and a second layer pattern have been formed, when said mask pattern is projected onto said exposure area, comprising the steps of:

(a) measuring coordinate values of a first alignment mark formed on said first layer pattern and a second alignment mark formed on said second layer pattern, each of said alignment marks being in a plurality of slit-shaped patterns extending in a first direction and spaced apart from each other by a predetermined pitch in a second direction which is perpendicular to said first direction;

(b) determining a reference coordinate value for said predetermined exposure area on the basis of said first alignment mark and said second alignment mark; and (c) moving said mask and said substrate relative to each other on the basis of said reference coordinate value so that said area is exposed to the image of the pattern of the mask.

7. A method according to claim 6, further comprising the steps of:

(d) repeating said measuring and determining steps so as to determine reference coordinate values for at least three exposure areas;

(e) calculating reference coordinate values for all of said plurality of exposure areas through a statistical process on the basis of said reference coordinate values determined in said repeating step; and (f) moving said mask and said substrate relative to each other on the basis of the calculated reference coordinate values so that said plurality of exposure areas are exposed to the image of the pattern of the mask.

8. An aligning method for performing alignment between a mask pattern and a predetermined exposure area on a substrate on which a first layer pattern and a second layer pattern have been formed, when said mask pattern is projected onto said exposure area, comprising the steps of:

(a) measuring coordinate values of a first alignment mark formed on said first layer pattern and a second alignment mark formed on said second layer pattern;

(b) determining a reference coordinate value by using weighted mean of the coordinate values of said first and second alignment marks, in accordance with the degree of significance in the relationship between said first and second layer patterns and said mask pattern for said predetermined exposure area; and (c) moving said mask and said substrate relative to each other on the basis of said reference coordinate value so that said area is exposed to the image of the pattern of the mask.

* * * * *